(12) United States Patent
Qi et al.

(10) Patent No.: US 9,553,110 B2
(45) Date of Patent: Jan. 24, 2017

(54) ARRAY SUBSTRATE, DISPLAY DEVICE AND METHOD OF MANUFACTURING THE ARRAY SUBSTRATE

(71) Applicant: BOE TECHNOLOGY GROUP CO., LTD., Beijing (CN)

(72) Inventors: Yonglian Qi, Beijing (CN); Shi Shu, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 246 days.

(21) Appl. No.: 14/360,082

(22) PCT Filed: Jun. 19, 2013

(86) PCT No.: PCT/CN2013/077445
§ 371 (c)(1),
(2) Date: May 22, 2014

(87) PCT Pub. No.: WO2014/153859
PCT Pub. Date: Oct. 2, 2014

(65) Prior Publication Data
US 2015/0249097 A1 Sep. 3, 2015

(30) Foreign Application Priority Data
Mar. 29, 2013 (CN) .......................... 2013 1 0108994

(51) Int. Cl.
*H01L 21/44* (2006.01)
*H01L 27/12* (2006.01)
(Continued)

(52) U.S. Cl.
CPC ........... *H01L 27/124* (2013.01); *G02F 1/1368* (2013.01); *G02F 1/133514* (2013.01);
(Continued)

(58) Field of Classification Search
CPC ............... H01L 27/124; H01L 27/1248; H01L 27/1259; H01L 27/1288; H01L 27/322
See application file for complete search history.

(56) References Cited

U.S. PATENT DOCUMENTS 6,717,638 B1 * 4/2004 Kim .................. G02F 1/133514
349/106
7,253,855 B2 * 8/2007 Lee ....................... G02F 1/1362
349/106
(Continued)

FOREIGN PATENT DOCUMENTS

CN 1862350 A 11/2006
CN 203179884 A 9/2013

OTHER PUBLICATIONS

International Preliminary Report on Patentability Appln. No. PCT/CN2013077445; Dated Sep. 29, 2015.
(Continued)

*Primary Examiner* — Zandra Smith
*Assistant Examiner* — John M Parker
(74) *Attorney, Agent, or Firm* — Ladas & Parry LLP (57) ABSTRACT

An array substrate, a display device comprising the array substrate and a method of manufacturing the array substrate are provided. The array substrate include a substrate (1) and a plurality of sub-pixel units on the substrate (1), and each of the sub-pixel units includes a thin film transistor main body layer (2) and a color filter layer (5) disposed above the thin film transistor main body layer (2), and the thin film transistor main body layer (2) includes a gate layer (21), a source layer, a drain layer (24) and a passivation layer (25), an additional layer (7) is further disposed on an upper surface of the thin film transistor main body layer (2), a hollow photoresist material containing part (50) is disposed in a region of the additional layer corresponding to each of the sub-pixel units, a color film material is disposed within
(Continued)

the photoresist material containing part (50), and a pixel electrode via hole (6) is formed in the additional layer (7) and the passivation layer (25) at a region corresponding to the drain layer (24). The thin film transistor in the array substrate has a more stable performance, the array substrate has a simpler manufacturing process and lower cost, and the display devices comprising the array substrate has a more stable performance.

19 Claims, 6 Drawing Sheets

(51) Int. Cl.
    *G02F 1/1362*    (2006.01)
    *G02F 1/1335*    (2006.01)
    *G02F 1/1368*    (2006.01)
    *H01L 21/768*    (2006.01)
    *H01L 27/32*     (2006.01)
(52) U.S. Cl.
    CPC .. *G02F 1/136227* (2013.01); *H01L 21/76802* (2013.01); *H01L 21/76877* (2013.01); *H01L 27/1248* (2013.01); *H01L 27/3244* (2013.01); *H01L 27/3258* (2013.01); *G02F 2001/136222* (2013.01); *H01L 27/322* (2013.01)

(56) References Cited

U.S. PATENT DOCUMENTS

| | | | |
|---|---|---|---|
| 2001/0010884 A1* | 8/2001 | Guehler | G02F 1/133516 430/7 |
| 2009/0108264 A1* | 4/2009 | Inoue | C23C 26/00 257/59 |
| 2010/0019246 A1 | 1/2010 | Kim et al. | |

OTHER PUBLICATIONS

First Chinese Office Action Application No. 201310108994.4; Dated Mar. 19, 2015.
International Search Report maield May 12, 2013; PCT/CN2013/077445.

* cited by examiner

ARRAY SUBSTRATE, DISPLAY DEVICE AND METHOD OF MANUFACTURING THE ARRAY SUBSTRATE

TECHNICAL FIELD

Embodiments of the present invention relate to an array substrate, a display device and a method of manufacturing the array substrate.

BACKGROUND

Along with technical developments, flat panel display devices have substituted bulky CRT display devices and become current mainstream display devices. Currently, common flat panel display devices comprise an LCD (Liquid Crystal Display) and an OLED (Organic Light-Emitting Diode) display device.

The liquid crystal display device comprises an array substrate and a color filter substrate between which liquid crystals are filled. A thin film transistor (TFT) is disposed on the array substrate, and is a control member as to whether light can be emitted out of the display device, and the TFT comprises a plurality of layer structures such as a gate layer, a gate insulating layer, an active layer, a passivation layer and a source/drain layer; a color filter layer (also called a color filter sheet) is disposed on the color filter substrate, and the color filter layer is a key member as to whether the display device can be colorized and comprises a plurality of color sub-layers such as red, green and blue. The white light emitted from a backlight passes through the color filter layer and generates three primary colors of red, green and blue respectively by way of the color resist of the color filter layer; meanwhile, a thin film transistor array is used to adjust the voltage loaded on the electrodes, such that liquid crystal molecules are deflected to control the passage of the light, change the proportion of the three primary colors, and finally achieve the color display of images. During manufacturing the liquid crystal display device, usually the color filter substrate and the array substrate are manufactured respectively, and then the color filter substrate and the array substrate are assembled and packaged together. In order to ensure the normal operation of the liquid crystal panel, it requires a high precision on the alignment and assembling of the array substrate and the color filter substrate.

The OLED is a light emitting device using an organic solid semiconductor as a light emitting material, and the OLED display device is a display device using the OLED to realize image display. Wherein, the technology of a white OLED (i.e., WOLED) is especially mature and has good stability and a simple manufacturing process, thus is widely used in display devices. Being the same with the liquid crystal display device, the WOLED display device uses the color filter layer to realize colorization.

In the liquid crystal display device or the WOLED display device, each externally visible minimum pixel point (i.e., "visible pixel") is constituted by a plurality of pixel units, and each of the pixel units has different colors of color filter layers, thus the light which passes through different pixel units is changed into different colors after passing through the color filter layer, and the different colors of light are mixed to be the light emitted from the "visible pixel".

Figure 1A:
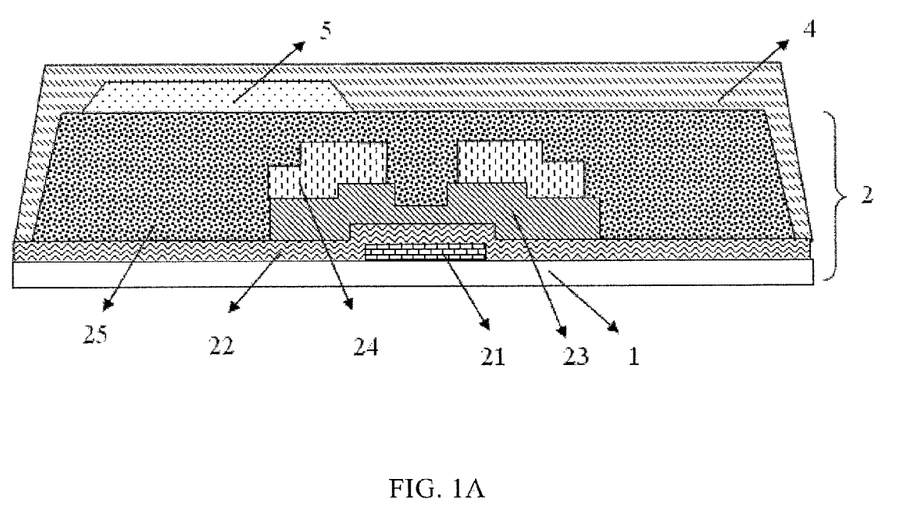
FIG. 1A is a structural schematic diagram of a color filter layer formed with a photoetching process on the array substrate.
Figure 1B:
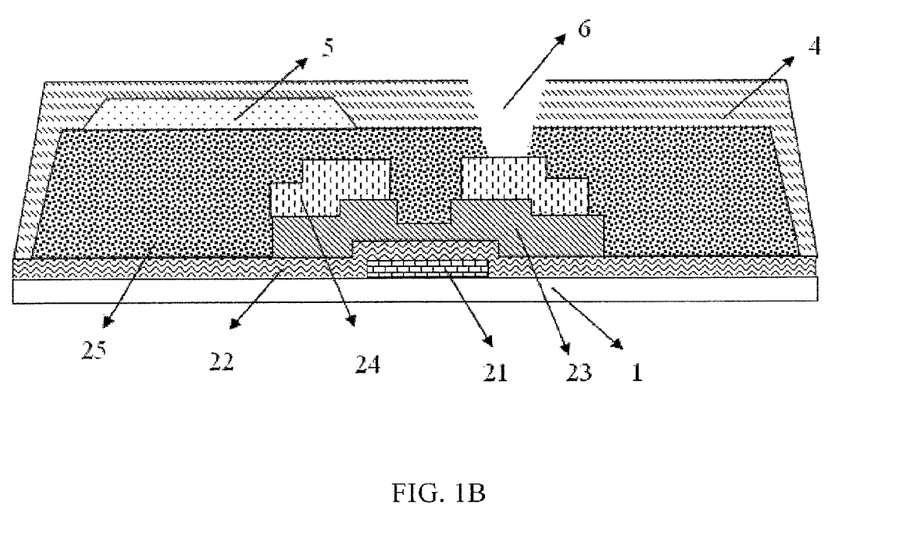
FIG. 1B is a structural schematic diagram of a pixel electrode via hole formed in the array substrate in FIG. 1A.

Along with the development of display technologies, currently, a mode that the color filter layer is disposed on the array substrate (Color Filter on Array, COA for short) to achieve color display appears in the WOLED display device. As illustrated in FIGS. 1A and 1B, on the array substrate already formed with a thin film transistor main body layer 2 (comprising a gate layer 21, a gate insulating layer 22, an active layer 23, a source/drain layer 24 and a passivation layer 25 (PVX for short)), a color filter layer 5 is formed on the passivation layer 25 using a photoetching process (comprising a plurality of steps such as coating, exposing and developing), as illustrated in FIG. 1A; and then a flat protective layer 4 is formed on the color filter layer 5, and finally a pixel electrode via hole 6 is formed, as illustrated in FIG. 1B. Using this mode can save the separate manufacturing of the color filter substrate, and the precision on the alignment and assembling of the color filter substrate and the array substrate need not be considered; and the manufactured array substrate has good stability, thus it is currently a common method to achieve the full color of the WOLED display device. However, as illustrated in FIG. 1, the passivation layer 25 of the thin film transistor main body layer further comprises the pixel electrode via hole 6 (Via Hole), the pixel electrode via hole 6 is firstly formed above the thin film transistor main body layer 2, and when the photoetching process is adopted to form the color filter layer 5, the step of coating the photoresist material and the metal ions, water molecules and etc. in the developer adopted in the developing step in the photoetching process affect the characteristics of the thin film transistor; also, a color filter layer 5 is first formed on the thin film transistor main body layer 2, and when the pixel electrode via holes 6 are etched in the passivation layer 25, the acid substance and etc. in an etching liquid affect the characteristics of the color filter layer 5.

During manufacturing the liquid crystal display device, although the color filter layer can be formed on the array substrate referring to the COA mode by which the WOLED display device achieves color display, according to the method of adopting the photoetching process to form the color filter layer in the prior art, the problem of affecting the characteristics of the thin film transistor will inevitably appear.

SUMMARY

One of objects of the embodiments of present invention is to solve the above defects in the prior art, and provide an array substrate, a display device comprising the array substrate and a method of manufacturing the array substrate, and the thin film transistor in the array substrate has more stable performance, the manufacturing process of the array substrate is simpler and the cost is lower, and the performance of the display device comprising the array substrate is more stable.

An embodiment of the present invention provides an array substrate, comprising a substrate and a plurality of sub-pixel units on the substrate, and each of the sub-pixel units comprises a thin film transistor main body layer and a color filter layer disposed above the thin film transistor main body layer, the thin film transistor main body layer comprises a gate layer, a source layer, a drain layer and a passivation layer, an additional layer is further disposed on an upper surface of the thin film transistor main body layer, a hollow photoresist material containing part is disposed in a region of the additional layer corresponding to each of the pixel units, a color film material is disposed within the photoresist material containing part, and a pixel electrode via hole is formed in the additional layer and the passivation layer at a region corresponding to the drain layer.

In one example, the photoresist material containing part is disposed on an upper surface layer of the additional layer, and a bottom of the photoresist material containing part is separated from the upper surface of the thin film transistor main body layer;

or, the photoresist material containing part penetrates the additional layer, and a bottom of the photoresist material containing part contacts the upper surface of the thin film transistor main body layer.

In one example, the photoresist material containing part has a shape of an inverted a rectangular truncated pyramid body or cuboid solid, and t the bottom of the photoresist material containing part has an area equal to that of the corresponding sub-pixel unit.

In one example, a region where the photoresist material containing part is not disposed in the additional layer has a thickness larger than or equal to that of the color filter layer, and the photoresist material containing part has a depth equal to the thickness of the color filter layer.

In one example, the additional layer is formed of positive photoresist or negative photoresist.

Another embodiment of the present invention provides a display device, and the display device comprises the above array substrate.

In one example, the display device further comprises a liquid crystal layer which is disposed above the color filter layer.

In one example, the display device further comprises an organic light emitting layer which is disposed above the color filter layer.

A further embodiment of the present invention provides a method of manufacturing the above array substrate, in which a patterning process is used to form an additional layer on an upper surface of the thin film transistor main body layer on the array substrate, a hollow photoresist material containing part is formed in a region of the additional layer corresponding to each sub-pixel unit, and a pixel electrode via hole is formed in the additional layer and the passivation layer at a region corresponding to the drain layer.

In one example, the method specifically comprises:

adopting a blade coating method, or a spin coating method, or a combination of the blade coating and the spin coating to form an additional layer formed of a photoresist on the thin film transistor main body layer of the array substrate;

adopting a gray-tone mask or half-tone mask to expose the additional layer and develop the exposed additional layer, wherein, after the developing, the photoresist in the region of the additional layer corresponding to the region where the photoresist material containing part is formed is partially removed, the photoresist in the region of the additional layer corresponding to the region where the pixel electrode via hole is formed is removed completely, and thereby a portion of the passivation layer is exposed, and the photoresist in other regions of the additional layer is completely preserved;

postbaking the array substrate to cure the additional layer;

etching the array substrate to form the pixel electrode via hole in the exposed portion of the passivation layer;

adopting an ink-jet method to fill a color filter material in the photoresist material containing part to form a color filter layer; and forming a pixel electrode in the pixel electrode via hole.

In one example, the method specifically comprises:

adopting a blade coating method, or a spin coating method, or a combination of the blade coating and the spin coating to form an additional layer formed of photoresist on the thin film transistor main body layer of the array substrate;

adopting a normal mask to expose the additional layer and develop the exposed additional layer, wherein, after the developing, the photoresist in the region of the additional layer corresponding to the region where the photoresist material containing part is formed and the region where the pixel electrode via hole is formed is removed completely, and thereby a portion of the passivation layer and the photoresist material containing part is formed, and the photoresist in other regions of the additional layer is completely preserved;

postbaking the array substrate to cure the additional layer;

adopting an ink-jet method to fill a color filter material in the photoresist material containing part to form a color filter layer;

etching the array substrate to form the pixel electrode via hole in the exposed portion of the passivation layer; and forming a pixel electrode in the pixel electrode via hole.

In one example, in the step of forming the pixel electrode via hole, a dry etching method is adopted to etch the array substrate.

The advantageous effect of the embodiments of the present invention lies in that the thin film transistor in the array substrate has a more stable performance, the array substrate has a simpler manufacturing process and lower cost, and the display devices comprising the array substrate has a more stable performance.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

FIGS. 1A and 1B are structural schematic diagrams of an array substrate in the prior art, wherein.

FIGS. 3A-3F are diagrams illustrating a flow chart for forming the array substrate in FIG. 2, wherein.

FIGS. 5A and 5B are schematic diagrams illustrating a part of flow chart for forming the array substrate in FIG. 4, wherein.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In order to have one skilled in the art better understand the technical solutions of the embodiments of the present invention, an array substrate, a display device comprising the array substrate and a method of manufacturing the array substrate according to embodiments of the present invention will be further detailed hereinafter in combination with the drawings and the specific embodiments.

An embodiment of the present invention provides an array substrate, comprising a substrate and a plurality of sub-pixel units on the substrate, and each of the sub-pixel units comprises a thin film transistor main body layer and a color filter layer above the thin film transistor main body layer; the thin film transistor main body layer comprises a gate layer, a source layer, a drain layer and a passivation layer, an additional layer is disposed on an upper surface of the thin film transistor main body layer, a hollow photoresist material containing part is disposed in a region of the additional layer corresponding to each of the sub-pixel units, a color filter material is disposed within the photoresist material containing part, and a pixel electrode via hole are formed in the additional layer and the passivation layer at a region corresponding to the drain layer.

Another embodiment of the present invention provides a display device comprising the array substrate.

A further embodiment of the present invention provides a method of manufacturing the array substrate, in which a patterning process is used to form an additional layer on an upper surface of a thin film transistor main body layer of the array substrate, a hollow photoresist material containing part is formed in a region of the additional layer corresponding to each of the sub-pixel units, and a pixel electrode via hole is formed in the additional layer and the passivation layer at a region corresponding to the drain layer.

Embodiment 1

A display device of the present embodiment is a liquid crystal display device. The liquid crystal display device comprises an array substrate and a color filter layer formed on the array substrate, i.e., the color filter layer is disposed above the array substrate already formed with the thin film transistor.

Figure 2:
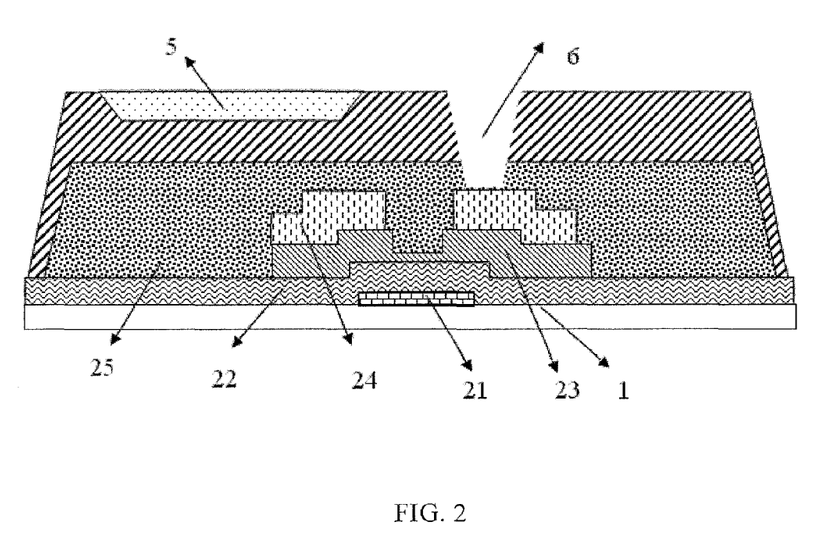
FIG. 2 is a structural schematic diagram of an array substrate in embodiment 1 of the present invention.

In the present embodiment, as illustrated in FIG. 2, the array substrate comprises a substrate 1 and a plurality of sub-pixel units located on the substrate, and each of the sub-pixel units comprises a thin film transistor main body layer 2 and a color filter layer 5 above the thin film transistor main body layer 2. An additional layer 7 is disposed on an upper surface of the thin film transistor main body layer 2, a hollow photoresist material containing part 50 is disposed in a region of the additional layer corresponding to each of the sub-pixel units, the color film material is disposed within the photoresist material containing part, and a pixel electrode via hole 6 is formed in the additional layer 7 and the passivation layer 25 at a region corresponding to the drain layer.

The thin film transistor main body layer 2 comprises a gate layer 21, a gate insulating layer 22, an active layer 23, a source/drain layer 24 and a passivation layer 25, which are sequentially laminated.

In the present embodiment, the additional layer 7 on the upper surface of the thin film transistor main body layer is formed of positive photoresist or negative photoresist. The additional layer 7 is provided with the hollow photoresist material containing part 50, the bottom of the photoresist material containing part 50 is apart from the upper surface of the thin film transistor main body layer 2, and the photoresist material containing part is filled therein with a color photoresist material to form the color filter layer 5. The color photoresist material has a light filtering function, and usually it needs to have characteristics of good heat resistance, high color saturation and good light transmittance.

The additional layer 7 corresponding to each of the sub-pixel units is provided with the photoresist material containing parts 50, and each of the photoresist containing parts 50 is filled with a photoresist material in one color. Generally, each of the pixel units comprises three sub-pixel units, the color filter layer is formed of color photoresist materials in red, green and blue colors, and each color of the color photoresist material corresponds to one sub-pixel unit.

In the present embodiment, the color photoresist materials are filled into the photoresist material containing parts via the ink-jet method, and are cured to form the color filter layer 5. The region of the additional layer 7 where the photoresist material containing parts 50 are not disposed has a thickness larger than that of the color filter layer 5, and the photoresist material containing part 50 has a depth equal to the thickness of the color filter layer 5. The depth of the photoresist material containing part 50 is in a range of 1.5-2.5 μm, and the bottom of the photoresist material containing part 50 has a distance in a range of 300-3000 Å with respect to the upper surface of the thin film transistor main body layer 2.

As illustrated in FIG. 2, in the present embodiment, the photoresist material containing part 50 has a shape of an inverted rectangular truncated pyramid body, and the area of the bottom of the photoresist material containing part 50 is equal to the area of the corresponding sub-pixel unit. Of course, the present embodiment does not limit the shape of the photoresist material containing part 50 to be the inverted rectangular truncated pyramid body, for example, the shape of the photoresist material containing part can also be a cuboid or other shapes, as long as the color photoresist material can be filled conveniently with the ink-jet method and the finally formed color filter layer has a thickness within the range acceptable to process error, which are not defined herein.

The photoresist material containing parts 50 can be arranged in a strip shape, a delta shape or a mosaic shape at the additional layer corresponding to each of the sub-pixel units.

The method of manufacturing the array substrate uses the patterning process to form the additional layer on the upper surface of the thin film transistor main body layer of the array substrate, forms the hollow photoresist material containing part in the region of the additional layer corresponding to each of the sub-pixel units, and forms the pixel electrode via holes in the additional layer and the passivation layer at the region corresponding to the drain layer.

Figure 3A:
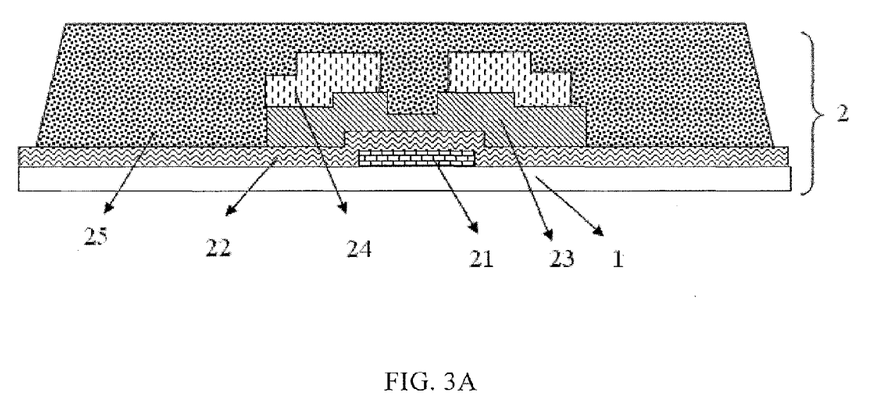
FIG. 3A is a structural schematic diagram of a thin film transistor main body layer.

As illustrated in FIGS. 3A-3F, the method specifically comprises the following steps:

Step S1): forming a thin film transistor main body layer on a substrate plate.

In the present step, a plurality of sub-pixel regions are arranged on the substrate, each sub-pixel region corresponds to a sub-pixel unit, and the sub-pixel unit comprises the thin film transistor main body layer on the substrate. As illustrated in FIG. 3A, on the substrate 1, the thin film transistor main body layer 2 comprises a gate layer 21, a gate insulating layer 22, an active layer 23, and a source/drain layer 24, which are sequentially laminated, and a passivation layer 25 above them. As the specific structure of the thin film transistor main body layer can be designed flexibly according to requirements, and the processes of forming the respective layers are identical with the prior art, thus are not described herein.

Figure 3B:
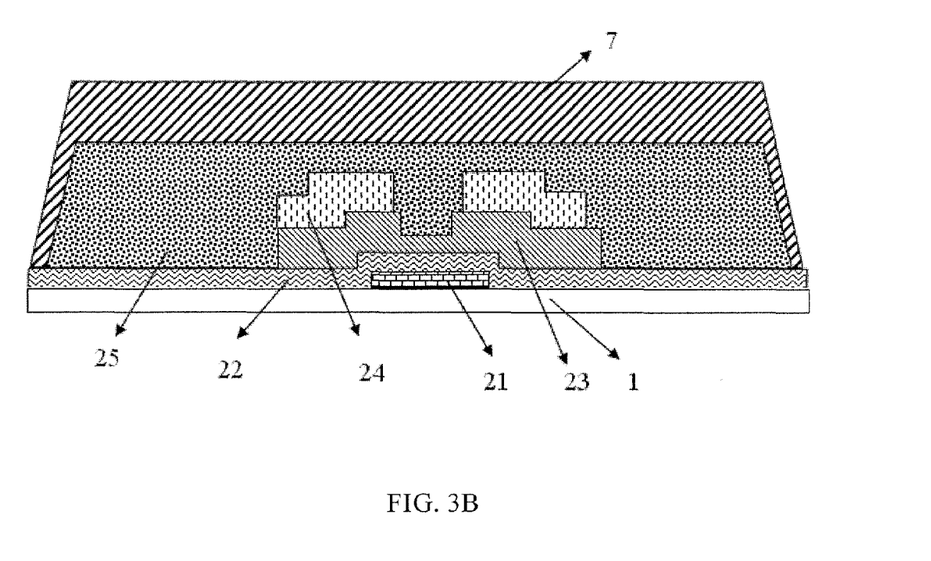
FIG. 3B is a structural schematic diagram of an additional layer formed on the thin film transistor main body layer.

Step S2): forming an additional layer on the upper surface of the thin film transistor main body layer.

In the step, the additional layer is formed of positive photoresist. The thickness of the additional layer is larger than that of the arranged color filter layer, to ensure that the bottom of the photoresist material containing part is apart from the upper surface of the thin film transistor main body layer.

As illustrated in FIG. 3B, a layer of positive photoresist is coated above the thin film transistor main body layer 2 with a blade coating method, or a spin coating method, or a combination of the blade coating and the spin coating, to form the additional layer 7, wherein the additional layer 7 has a thickness ranging 2-4 µm. The exposed region of the positive photoresist is more easily dissolved in a developer.

Figure 3C:
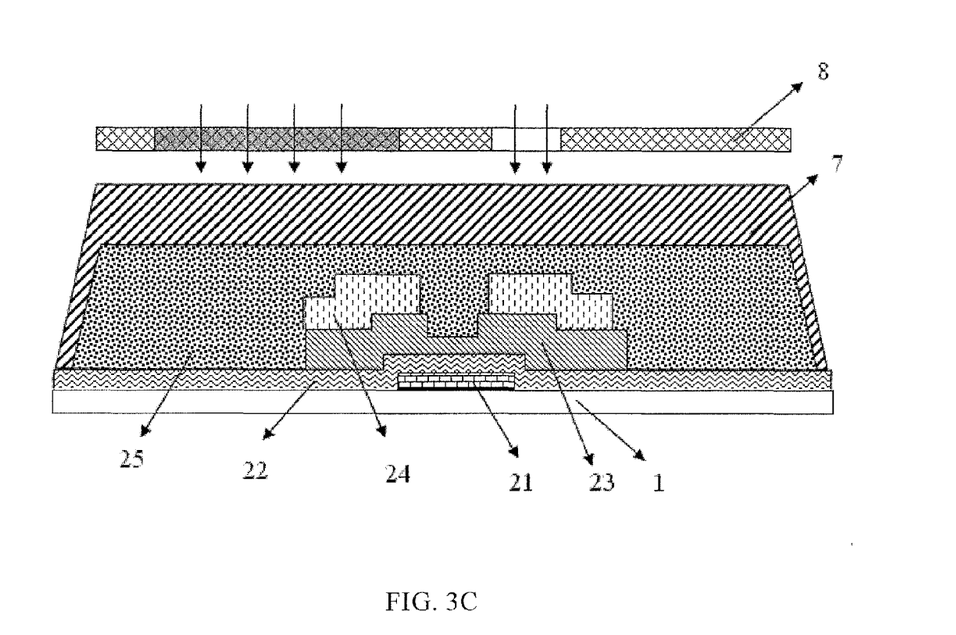
FIG. 3C is a schematic diagram of adopting mask to expose the additional layer.

Step S3): exposing the array substrate.

In the step, the photoresist material containing part 50 is formed on the upper surface layer of the additional layer 7 with a photoetching process. The photoetching process comprises an exposing step, as illustrated in FIG. 3C, the light transmittance amount of a mask plate 8 adopted in the exposing step corresponding to the region where the photoresist material containing part 50 is formed is smaller than that corresponding to a via hole region 60 where the pixel electrode via holes 6 of the thin film transistor are formed, while larger than that of other regions. Specifically, the light transmittance amount of the via hole region 60 where the thin film transistor is formed corresponding to the mask plate 8 result in complete exposure of the additional layer 7 of the corresponding region, and the light transmittance amount of the region where the photoresist material containing part 50 is formed corresponding to the mask plate 8 results in that the additional layer 7 of the corresponding region is not completely exposed, wherein, the gray-tone mask or half-tone mask can be adopted to achieve incomplete exposure. Then, the region of the additional layer 7 corresponding to the region where the photoresist material containing part 50 is formed is a half exposed region, the region of the additional layer 7 corresponding to the via hole region 60 where the pixel electrode via holes 6 are formed is a complete exposed region, and other regions of the additional layer 7 except the above two regions are unexposed regions.

Between the coating step and the exposing step, a vacuum drying step and a prebaking step are further contained, and the prebaking temperature ranges 80-120° C.

Step S4): developing the array substrate.

In the step, the photoresist in the complete exposed region of the additional layer 7 is completely removed, and thereby a portion of the passivation layer 25 is exposed, i.e., the passivation layer 25 corresponding to the via hole region 60 where the pixel electrode via holes 6 are formed is exposed completely; the photoresist in the half exposed region of the additional layer 7 is removed partially, and thereby the photoresist material containing part 50 is formed, and the photoresist in the unexposed region of the additional layer 7 is preserved completely. As the additional layer 7 is formed with the positive photoresist, the positive photoresist irradiated by light in the exposing process has chemical reaction due to light sensitivity and then is easily dissolved in the developer, and thus is removed.

Figure 3D:
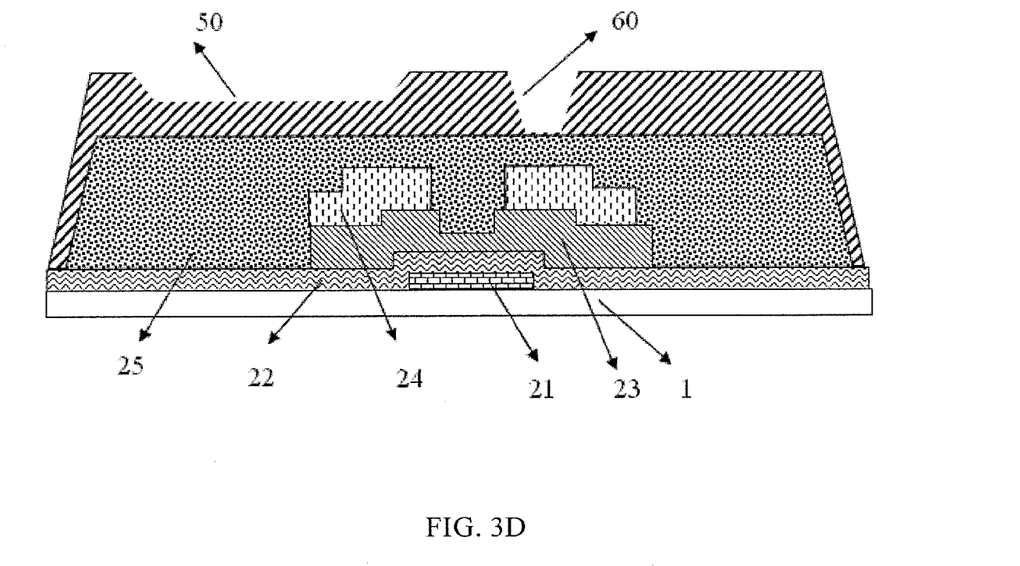
FIG. 3D is a schematic diagram of forming a photoresist material containing part and a pixel electrode via hole region after developing and postbaking based on FIG. 3C.

Step S5): postbaking the array substrate, and thereby curing the additional layer.

In the step, the temperature for the postbaking is in a range of 220-240° C., the postbaking time is in a range of 40-50 min. As illustrated in FIG. 3D, after the postbaking step, a concave pit in a shape of an inverted rectangular truncated pyramid body is formed in the region where the photoresist material containing part 50 is formed, the bottom of the concave pit has a distance (apart from) from the upper surface of the thin film transistor main body layer 2, and the four sidewalls of the additional layer 7 surrounding the photoresist material containing part 50 form a barricade. A portion of the photoresist layer preserved between the bottom of the concave pit and the upper surface of the thin film transistor main body layer 2 serves a fine protective function to the thin film transistor main body layer 2.

Figure 3E:
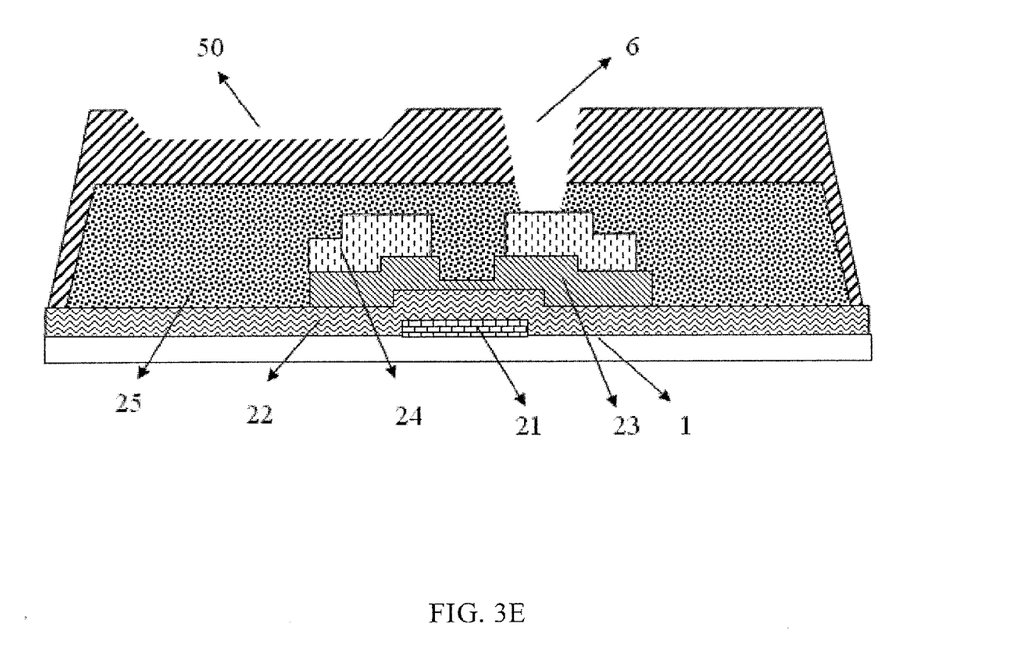
FIG. 3E is a schematic diagram of forming the pixel electrode via hole on the basis of FIG. 3D through etching.

Step S6): etching the array substrate.

In the step, the pixel electrode via holes are formed in the complete exposed region of the additional layer and the exposed portion of the passivation layer. As illustrated in FIG. 3E, the above array substrate is subjected to the etching step, and the material in the passivation layer 25 corresponding to the via hole region 60 is removed to finally form the pixel electrode via hole 6. The etching step adopts the dry etching method through which the pixel electrode via hole 6 are formed in the passivation layer 25 via the chemical effects of $SF_6$ and $O_2$, and the pixel electrode via hole 6 results in the connection between the pixel electrode layer and the drain layer.

Figure 3F:
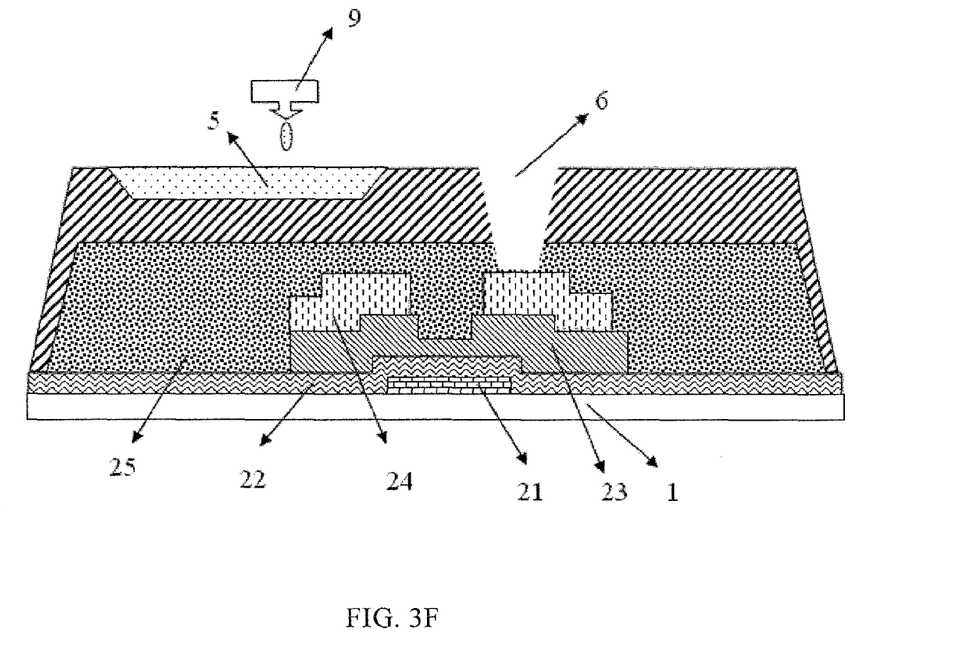
FIG. 3F is a schematic diagram of forming a color filter layer with an ink-jet method in the photoresist material containing part of FIG. 3E.

Step S7): then, further adopting the ink-jet method to fill the color filter material in the photoresist material containing part to form the color filter layer.

In the step, a spray head 9 is directed at the photoresist material containing part 50 to respectively drip red, green and blue color photoresist materials (i.e., ink droplets) which can form red, green and blue color filter layers after a curing step, as illustrated in FIG. 3F. The color photoresist materials comprise a low polymer, a pigment, an organic solvent, an additive and etc., according to used spray heads (including a hot bubble type and a piezoelectric type spray heads), the low polymers in the photoresist materials are not completely identical. Using the ink-jet method to form the color filter layer has the advantages of low cost, simple process, high utilization rate of the pigments and etc.

Step S8), finally forming a pixel electrodes in the pixel electrode via hole.

In the step, indium tin oxide (ITO for short) is used to manufacture the pixel electrode layer above the array substrate already formed with the color filter layer 5, an alignment layer is formed, then liquid crystals are dripped, a glass substrate without pattern is used for assembling, and then packaging is conducted to form the liquid crystal display device.

In the present embodiment, the pixel electrode via hole is first formed above the thin film transistor main body layer, at this moment, the thin film transistor main body layer, due to the protection from the additional layer, can effectively avoid the influence of the developing step on the characteristics of the thin film transistor; meanwhile, after forming the pixel electrode via hole necessary for the thin film transistor, then the color filter layer is formed above the thin film transistor main body layer through the ink jet method, which can effectively avoid the influence of acid substances and etc. in the etchant used in forming the pixel electrode via hole on the characteristics of the color filter layer. After the liquid crystal display device is assembled, the additional layer can effectively prevent the thin film transistor from being polluted by the liquid crystals.

Compared with the prior art, although the present embodiment also uses the ink-jet method to manufacture the color filter layer, while does not need a special process to in advance form the barricade as in the prior art, while only needs a half-tone mask or gray-tone mask to form the photoresist material containing part which can be disposed with the color filter layer in the process of forming the pixel electrode via hole of the passivation layer, thus it is convenient to use the ink-jet method to drip the photoresist materials in predetermined colors such as red, green and blue, into the corresponding pixel units, and thereby corresponding colors of the color filter layers are formed.

Meanwhile, compared with the prior art, in the present embodiment, after the color filter layer is accomplished with the COA mode, as the photoresist layer above the passivation layer is used directly as the barricade, and the step is very small, a flat protective layer does not need to be arranged independently above color filter layer, such that the present embodiment reduces a process step compared with the prior art which has to adopt the flat protective layer to improve the smoothness of the upper surface of the color filter layer.

To sum up, compared with the process of forming the color filter substrate with the ink-jet method in the prior art, the process for forming the color filter layer in the present embodiment is simpler and the cost is lower.

Embodiment 2

Figure 4:
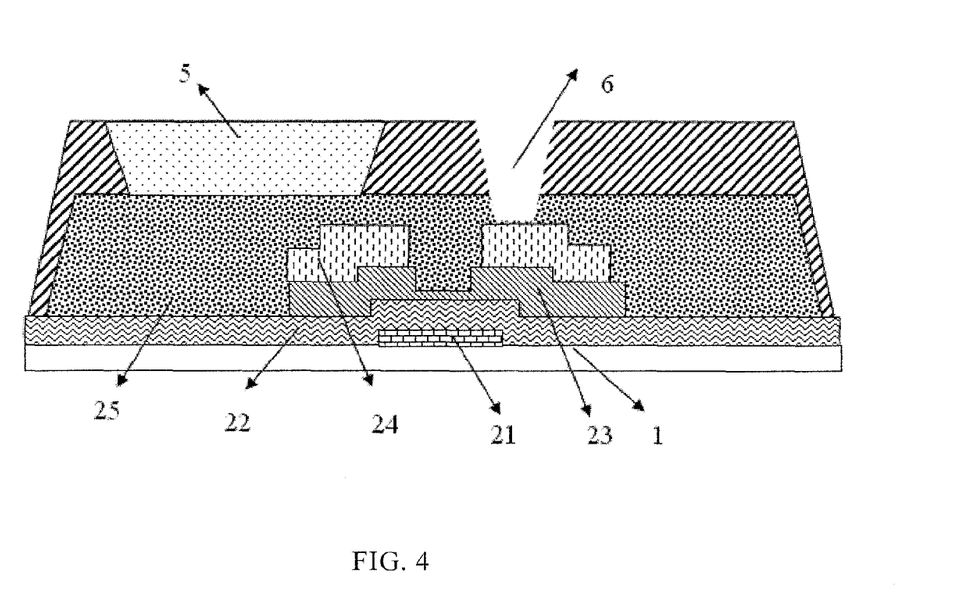
FIG. 4 is a structural schematic diagram of an array substrate in embodiment 2 of the present invention.

The difference between the present embodiment and embodiment 1 lies in that, in the array substrate of the present embodiment, as illustrated in FIG. 4, the photoresist material containing part penetrates the additional layer 7, and the bottom of the photoresist material containing part 50 contacts the upper surface of the thin film transistor main body layer 2.

Correspondingly, the region of the additional layer 7 where the photoresist material containing part 50 is not disposed has a thickness equal to that of the color filter layer 5, and the depth of the photoresist material containing part 50 is equal to that of the color filter layer.

Figure 5A:
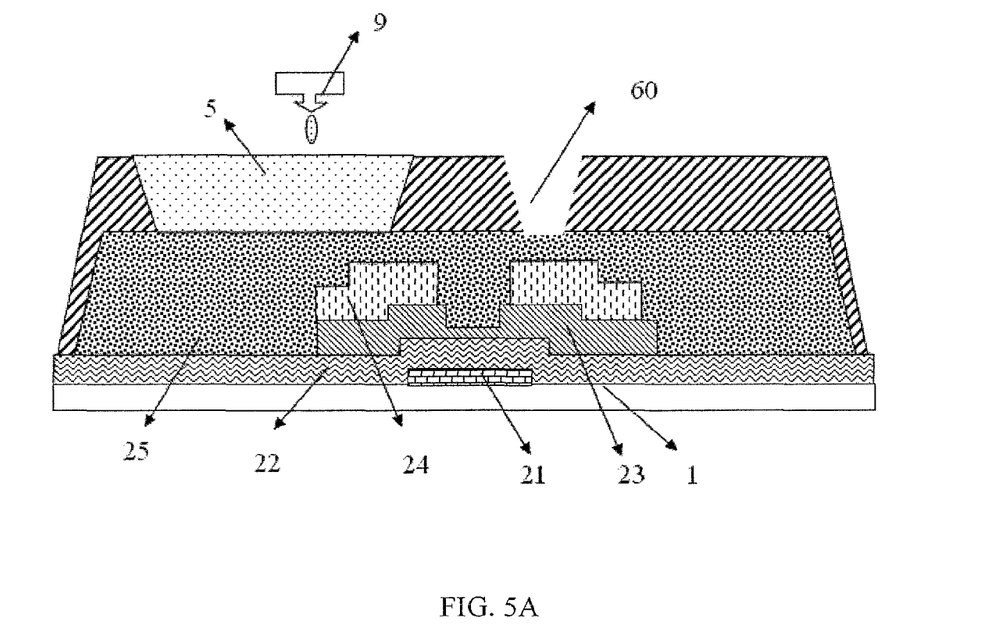
FIG. 5A is a schematic diagram of forming a photoresist material containing part and a pixel electrode via hole region on an addition layer after developing, postbaking and etching.
Figure 5B:
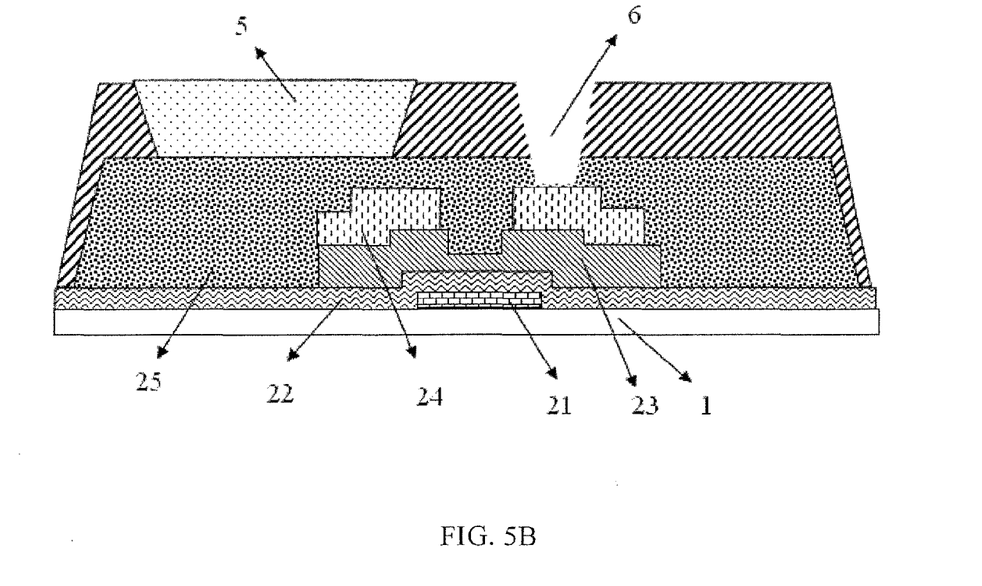
FIG. 5B is a schematic diagram of forming a color filter layer in the photoresist material containing part of FIG. 5A with an ink-jet method.

The specific method for manufacturing the array substrate of the present embodiment is to first form the thin film transistor main body layer 2 on the substrate 1, and then the following steps are conducted:

Step S1): adopting a blade coating method, or a spin coating method, or a combination of the blade coating and the spin coating to form the additional layer 7 formed of the photoresist on the thin film transistor main body layer 2 of the array substrate;

Step S2): adopting a normal mask to expose the additional layer 7, wherein, the region of the additional layer 7 corresponding to the region where the photoresist material containing part 50 is formed and the region of the additional layer 7 corresponding to the region where the pixel electrode via holes 6 are formed are complete exposed regions, while other regions of the additional layer 7 are unexposed regions;

Step S3): developing the array substrate, wherein the photoresist in the complete exposed region of the additional layer 7 is completely removed, and thereby a portion of the passivation layer 25 is exposed and the photoresist material containing part 50 is formed, and the photoresist in the unexposed region of the additional layer 7 is completely preserved;

Step S4): postbaking the array substrate to cure the additional layer;

Step S5): adopting the ink-jet method to fill the color filter materials in the photoresist material containing part 50 to form the color filter layer 5, as illustrated in FIG. 5A;

Step S6): etching the array substrate to form the pixel electrode via holes 6 in the exposed portion of the passivation layer 25, as illustrated in FIG. 5B; and Step S7): forming pixel electrodes in the pixel electrode via hole 6.

Please refer to the manufacturing process of the array substrate in embodiment 1 for the specific manufacturing process in each of the above steps, which are omitted herein.

In the present embodiment, a dry etching method is adopted to etch the array substrate. Then, the color filter layer 5 has certain protection function to the thin film transistor main body layer 2 corresponding to the region where the photoresist material containing part 50 is formed, and prevents etching the region of the passivation layer 25 where the photoresist material containing part 50 is formed; while the affection of the dry etching method to the color filter layer is at most several hundreds of microns, thus can be ignored, and then the process for making the barricade in the prior art, in which the barricade is first formed and then the ink-jetting is performed, is saved, so that the process flow is simpler and the operation is easier. In addition, the color filter layer 5 is not formed with the photoetching process, thus the influence of the coating and developing steps on the characteristics of the thin film transistor is avoided.

In addition, in the manufacturing methods in embodiments 1 and 2, only the positive photoresist is taken as an example to describe respective steps. However, the embodiments of the present invention are not limited to the positive photoresist, while the negative photoresist can also be used. When the negative photoresist is used, the photoresist of the complete exposed region is completely preserved after developing, while the photoresist in the unexposed region is completely removed after developing, which are not further described herein.

Embodiment 3

Being different from embodiments 1 and 2, the array substrate of the present embodiment is applied to the WOLED display device.

In the present embodiment, the display device further comprises OLEDs disposed above the color filter layer, and each of the OLEDs corresponds to one of the sub-pixel units.

Being different from embodiments 1 and 2, in the present embodiment, after accomplishing the manufacturing of the color filter layer on the array substrate with the COA mode, a metal anode layer is first formed above the color filter layer connected with the pixel electrode layer, then a pixel define layer (PDL for short) is further made and a light emitting layer (EL for short) is coated, and finally a metal cathode layer is formed by sputtering, and packaging is conducted to form the OLED display device.

The structure and the manufacturing method of the array substrate of the present embodiment are identical with embodiment 1 or 2, and are not further described herein.

Embodiments 1-3 provide an array substrate and a method for manufacturing the array substrate by the combination of the COA mode and the ink-jet method, in which the barricade is formed with the additional layer through the steps of exposing, developing and postbaking, and the two photoetching process steps in the prior art of forming the barricade necessary for forming the color filter layer with the ink-jet method and forming the flat protective layer for flattening are saved, thus the present invention simplifies the process and achieves a lower cost, and avoid the influence on the thin film transistor in the process of making the barricade, such that the thin film transistor has a more stable performance, and meanwhile the performance of the array substrate is more stable.

The embodiments of the present invention uses the ink jet method to form the color filter layer on the array substrate, and are especially applicable to producing large-sized array substrate, and makes large-sized display panels feasible.

The embodiments described above are just exemplary ones of the present invention, and are not intended to limit the scope of protection of the invention. The scope of protection of the present invention shall be defined by the appended claims.

The invention claimed is:

1. An array substrate, comprising a substrate and a plurality of sub-pixel units on the substrate, each of the sub-pixel units comprising a thin film transistor main body layer and a color filter layer disposed above the thin film transistor main body layer, and the thin film transistor main body layer comprising a gate layer, a source layer, a drain layer and a passivation layer, wherein, an additional layer is further disposed on an upper surface of the thin film transistor main body layer, a recessed part for accommodating photoresist material is disposed in a region of the additional layer corresponding to each of the sub-pixel units, the recessed part for accommodating photoresist material is formed at an upper surface of the additional layer, a color film material is disposed within the recessed part for accommodating photoresist material, and a pixel electrode via hole is formed in the additional layer and the passivation layer at a region corresponding to the drain layer.

2. The array substrate according to claim 1, wherein, a bottom of the recessed part for accommodating photoresist material is separated from the upper surface of the thin film transistor main body layer;
   or, the recessed part for accommodating photoresist material penetrates the additional layer, and a bottom of the recessed part for accommodating photoresist material contacts the upper surface of the thin film transistor main body layer.

3. The array substrate according to claim 2, wherein, the recessed part for accommodating photoresist material has a shape of an inverted rectangular truncated pyramid body or a cuboid, and the bottom of the recessed part for accommodating photoresist material has an area equal to that of the corresponding sub-pixel unit.

4. The array substrate according to claim 2, wherein, a region of the additional layer without the recessed part for accommodating photoresist material has a thickness larger than or equal to that of the color filter layer, and the recessed part for accommodating photoresist material in the additional layer has a depth equal to the thickness of the color filter layer.

5. The array substrate according to claim 2, wherein, the additional layer is formed of positive photoresist or negative photoresist.

6. The array substrate according to claim 1, wherein, the recessed part for accommodating photoresist material has a shape of an inverted rectangular truncated pyramid body or a cuboid, and the bottom of the recessed part for accommodating photoresist material has an area equal to that of the corresponding sub-pixel unit.

7. The array substrate according to claim 6, wherein, a region of the additional layer without the recessed part for accommodating photoresist material has a thickness larger than or equal to that of the color filter layer, and the recessed part for accommodating photoresist material in the additional layer has a depth equal to the thickness of the color filter layer.

8. The array substrate according to claim 6, wherein, the additional layer is formed of positive photoresist or negative photoresist.

9. The array substrate according to claim 1, wherein, a region of the additional layer without the recessed part for accommodating photoresist material has a thickness larger than or equal to that of the color filter layer, and the recessed part for accommodating photoresist material has a depth equal to the thickness of the color filter layer.

10. The array substrate according to claim 9, wherein, the additional layer is formed of positive photoresist or negative photoresist.

11. The array substrate according to claim 1, wherein, the additional layer is formed of positive photoresist or negative photoresist.

12. A display device comprising the array substrate according to claim 1.

13. The display device according to claim 12, further comprising a liquid crystal layer disposed above the color filter layer.

14. The display device according to claim 12, further comprising an organic light emitting layer disposed above the color filter layer.

15. A method of manufacturing an array substrate, comprising: adopting a patterning process to form an additional layer on an upper surface of a thin film transistor main body layer on the array substrate, forming a recessed part for accommodating photoresist material at an upper surface of the additional layer and in a region of the additional layer corresponding to each sub-pixel unit, and forming a pixel electrode via hole in the additional layer and a passivation layer at a region corresponding to the drain layer.

16. The method according to claim 15, comprising:
   adopting a blade coating method, or a spin coating method, or the combination of the blade coating and the spin coating to form the additional layer formed of photoresist on the thin film transistor main body layer of the array substrate;
   adopting a gray-tone mask or half-tone mask to expose the additional layer and develop the exposed additional layer, wherein, after the developing, the photoresist in the region of the additional layer corresponding to the region where the recessed part for accommodating photoresist material is formed is partially removed, the photoresist in the region of the additional layer corresponding to the region where the pixel electrode via hole is formed is removed completely, and thereby a portion of the passivation layer is exposed; and the photoresist in other regions of the additional layer is completely preserved;

postbaking the array substrate to cure the additional layer;

etching the array substrate to form the pixel electrode via hole in the exposed portion of the passivation layer;

adopting an ink-jet method to fill a color filter material in the recessed part for accommodating photoresist material to form a color filter layer; and forming a pixel electrode in the pixel electrode via hole.

17. The method according to claim 16, wherein, in forming the pixel electrode via hole, a dry etching method is adopted to etch the array substrate.

18. The method according to claim 15, comprising:

adopting a blade coating method, or a spin coating method, or a combination of the blade coating and the spin coating to form an additional layer formed of photoresist on the thin film transistor main body layer of the array substrate;

adopting a normal mask to expose the additional layer and develop the exposed additional layer, wherein, after the developing, the photoresist in the region of the additional layer corresponding to the region where the recessed part for accommodating photoresist material is formed and the region where the pixel electrode via hole is formed is removed completely, and thereby a portion of the passivation layer is exposed and the recessed part for accommodating photoresist material is formed, and the photoresist in other regions of the additional layer is completely preserved;

postbaking the array substrate to cure the additional layer;

adopting an ink-jet method to fill a color filter material in the recessed part for accommodating photoresist material to form a color filter layer;

etching the array substrate to form the pixel electrode via hole in the exposed portion of the passivation layer; and forming a pixel electrode in the pixel electrode via hole.

19. The method according to claim 18, wherein, in forming the pixel electrode via hole, a dry etching method is adopted to etch the array substrate.

* * * * *